United States Patent [19]

Glück

[11] Patent Number: 6,015,981

[45] Date of Patent: Jan. 18, 2000

[54] HETEROSTRUCTURE FIELD-EFFECT TRANSISTORS (HFETS') WITH HIGH MODULATION EFFECTIVITY

[75] Inventor: Markus Glück, Ehingen, Germany

[73] Assignee: Daimler-Benz Aktiengesellschaft, Germany

[21] Appl. No.: 09/066,559

[22] Filed: Apr. 27, 1998

[30] Foreign Application Priority Data

Apr. 25, 1997 [DE] Germany .......................... 197 17 500

[51] Int. Cl.[7] .............................................. H01L 29/778
[52] U.S. Cl. ............... 257/194; 257/19; 257/20; 257/24
[58] Field of Search ............... 257/19–20, 24, 257/192, 194, 212

[56] References Cited

U.S. PATENT DOCUMENTS

| | | | |
|---|---|---|---|
| Re. 33,693 | 9/1991 | Bean et al. ................................. | 257/19 |
| 4,194,935 | 3/1980 | Dingle et al. ......................... | 257/192 X |
| 4,710,788 | 12/1987 | Dämbkes et al. ........................ | 257/194 |
| 4,797,716 | 1/1989 | Chaffin et al. ............................. | 257/18 |
| 5,258,632 | 11/1993 | Sawada ................................... | 257/194 |

FOREIGN PATENT DOCUMENTS

| | | |
|---|---|---|
| 0228516 | 7/1987 | European Pat. Off. . |
| 0683522 | 11/1996 | European Pat. Off. . |
| 3731000 | 3/1989 | Germany . |
| 4101167 | 7/1992 | Germany . |
| 2-130933 | 5/1990 | Japan ...................................... 257/20 |

OTHER PUBLICATIONS

Ismail, et al., "High–Performance Si/SiGe n–Type Modulation–Doped Transistors," IEEE Electron. Device Lett., vol. 14, No. 7, Jul. 1993, pp. 348–350.

Mark C. Foisy et al., "The Role of Inefficient Charge Modulation in Limiting the Current–Gain Cutoff Frequency of the MODFET", IEEE Transactions on Electron Devices, vol. 35. No. 7, Jul. 1988, pp. 871–878.

T.P. Pearsall et al., "$Ge_xSi_{1-x}$ Modulation–Doped p–Channel Field–Effect Transistors", Proceedings of the $1^{st}$ International Symposium On Silicon MBE, vol. 85–7 May 1985, pp. 400–405.

Nawaz, Muhammad, Jensen, Geir U.: Design of Active Phase Shifters Based on Multichannel Heterojunction Field Effect Transistors (MCHFET's). In: IEEE Transactions on Electron Devices, vol. 43, No. 11, Nov. 1996.

Shealy, J.B. et al.: High–Performance Submicrometer Gate length GaInAs/InP Composite Channel HEMT's with Regrown Ohmic Contacts. In: IEEE Electron Device Letters, vol. 17, No. 11, Nov. 1996.

O'Neill, A.G., Antoniadis, D.A.: Deep Submicron CMOS Based on Silicon Germanium Technology. In: IEEE Transactions on Electron Devices, vol. 43, No. 6, Jun. 1996.

Chertouk, M. et al.: Metamorphic InAlAS/InGaAs HEMT's on GaAs Substrates with an Novel Compossite Channels Design. In: IEEE Electron Device Letters, vol. 17, No. 6, Jun. 1996.

*Primary Examiner*—John Guay
*Attorney, Agent, or Firm*—Venable; George H. Spencer; Norman N. Kunitz

[57] ABSTRACT

The invention concerns heterostructure field effect transistors (HFET's) with high charge carrier concentration in the two-dimensional charge-carrier gas. The n-HFET of the heterostructure layer sequence contains several zones with formed 2DEG while the p-HFET contains several zones with formed 2DHG, which can be gate-controlled with a transistor gate, without mutually screening each other. At the same time, more charge carriers $n_s$ with high mobility are available through several channels. Higher transconductances for transistors are obtained with this, resulting in the promise of shorter switching times, especially for integrated circuits. In addition, other characteristics that are critical for the high-frequency technology, such as transit frequency and maximum operating frequency, can also be increased.

19 Claims, 3 Drawing Sheets

HETEROSTRUCTURE FIELD-EFFECT TRANSISTORS (HFETS') WITH HIGH MODULATION EFFECTIVITY

REFERENCE TO RELATED APPLICATIONS

This application claims the priority of German application Serial No. 197 17 500.7, filed Apr. 25, 1997, which is incorporated herein by reference.

BACKGROUND OF THE INVENTION

The invention relates to heterostructure field effect transistors with high modulation effectivity, of the type with having a heterostructure layer sequence deposited on the semiconductor substrate.

The new fields of application for modern communication electronics require the use of ever higher frequency ranges. In turn, this leads consistently to new requirements for the integrated circuits that form the basic elements of modern systems. Consequently, there is a demand for developing new types of transistors with low noise and improved power amplification or gain at ever higher operating frequencies. A completely new type of transistor was introduced for the first time by Mimura et al. "A New Field-effect Transistor With Selectively Doped GaAs/n–Al(x)Ga(1–x) As Heterojunctions" in *Japanese Journal of Applied Physics*, Vol. 19(5), pp. 225–27, 1980, with the development of an AlGaAs/GaAs heterostructure field-effect transistor (HFET). Thus, an experimental HFET concept with modulation doping—the term MODFET is also used frequently in this case—was presented by Dingle et al. "Electron Mobilities In Modulation-doped Semiconductor Heterostructure Superlattices", *Applied Physics Letter*, vol. 33(7), pp. 665–67, 1987, in this case for the production of a new type of high-speed transistor. Of importance for this is the purposeful use of a quantum effect occurring at a heterojunction in the active channel region for the charge carrier transport, in a so-called two-dimensional electron gas (2DEG), and the considerably improved transport qualities as compared to the pure semiconductor crystal, resulting from the spatial separation of free charge carriers in the channel region and caused by the reduction in the Coulomb scattering processes as a result of locally fixed, ionized impurity trunks in the doping region of a supply layer, in particular the very high mobility values with simultaneously high charge carrier concentrations.

The above mentioned type of transistor, formed on the basis of the semiconductor materials silicon (Si) and silicon/germanium alloys (Si/Ge) is known as p-conducting type from the article by T. P. Pearsall et al., "$Ge_xSi_{1-x}$ Modulation-doped P-channel Field-effect Transistor, *Proceedings of the 1$^{st}$ International Symposium On Silicon MBE*, Vol. 85–7, pp. 400–405, May 1985, Toronto, Canada, Ed. J. C.Bean, Electrochem. Soc., Pennington, N.J.). The MODFET specified therein consists of a semiconductor layer sequence, composed of alternating layers of silicon and silicon/germanium alloys that permit the configuration of a p-MODFET with a p-conducting channel. This channel is also very narrowly defined through a targeted influencing of the band structure in the semiconductor material and is referred to as a so-called two-dimensional hole gas (2DHG). N-conducting MODFET's, formed on the basis of the same Si and Si/Ge semiconductor material U.S. Pat. No. 4,710, 788; EP 02 28 516 B1; DE 37 31 000 C2 and DE 41 01 167 A1) are known as well. The references U.S. Pat. No. 4,710,788 and EP 02 28 516 B1 provide that a two-dimensional electron gas (2DEG) is generated with the aid of a heterojunction of a $Si_xGe_{1-x}/Si$ semiconductor layer sequence. In this case, the electrons are essentially conducted inside the Si semiconductor layer.

The references DE 37 31 000 C2, DE 41 01 167 A1 and EP 06 83 522 A2 show possible uses and varied designs for integrated semiconductor arrangements, composed of p-channel and n-channel HFET's, including the sequence of the individual semiconductor layers.

Also contained in the reference U.S. Pat. No. 4,710,788 are heterolayer sequences with several 2DEG channels, but which always have a highly doped region between neighboring channels. It is exactly these superimposed, highly doped regions, which screen each other mutually, so that only a limited control of the conducting channels through the gate is still possible. If the transistor is designed with one channel only, this screening effect does not occur, but the conductance is limited to only one zone of the two-dimensional charge carrier gas. Also, there is a natural limit on the number of charge carriers $n_s$ in a channel, and thus also a limit to the improvement of transistor characteristics. A value that determines the transistor characteristics is the so-called modulation effectivity (Foisy, M. C. et al., IEEE Translations on Electronic Development, Vol. 35, No. 7, pp. 871–77, 1988), which is a measure for the charge carriers that are present with high mobility in the two-dimensional charge carrier gas. Important transistor characteristics such as maximum operating frequency, transconductance, and transit frequency are positively influenced by an increase in the modulation effectivity.

It is thus the object of the present invention to provide a generic-type heterostructure field-effect transistor (n-HFET or p-HFET) with a heterostructure layer sequence, which on the whole results in an improvement of the transistor characteristics as compared to the state of the technology.

SUMMARY OF THE INVENTION

The above object generally is achieved according to the present invention by a heterostructure field effect transistor with high modulation effectivity, which has a heterostructure layer sequence deposited on a semiconductor substrate, wherein the layer packet of the heterostructure layer sequence is composed of several undoped layers and at least two n-conducting channels (n-HFET) or p-conducting (p-HFET) channels are formed by at least two heterojunctions.

In the heterostructure layer sequence, several zones with formed 2DEG are contained in the n-HFET and several zones with formed 2DHG are contained in the p-HFET, which can be gate-controlled by a transistor gate or even several transistor gates, without mutually screening each other. At the same time, more charge carriers $n_s$ with high mobility are also available through several channels. Thus, the invention has the advantage that higher transistor transconductances are achieved, which exceed the state of the technology and promise shorter switching times, especially for integrated circuits. In addition, other characteristics of particular importance to the high frequency technology, such as transit frequency and maximum operating frequency, can also be improved.

The invention is explained below in more detail with the aid of exemplary embodiments and by making reference to the schematic drawings in the following figures.

DETAILED DESCRIPTION OF THE PREFERRED EMBODIMENTS

Figure 1:
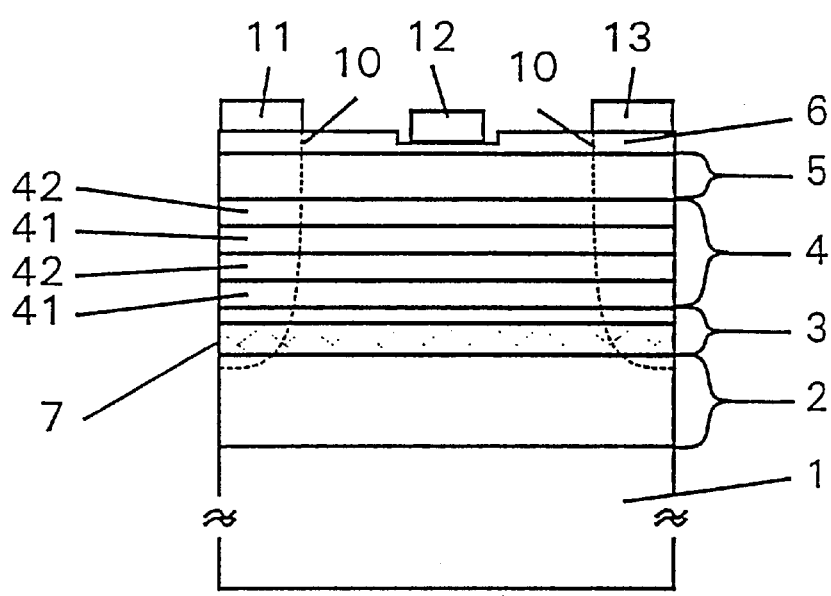
FIG. 1 is a schematic cross section through a two-channel HFET used for explaining the layer sequence.

The exemplary embodiment according to FIG. 1 shows a layer sequence for a HFET. The substrate 1 used here is a monocrystalline silicon substrate with orientation (100), generally used in semiconductor production, which has a specific resistance of, for example, $10^3$ Ωcm. As a result, interfering, parasitic capacities and leakage currents in the substrate material are prevented. With the aid of molecular-beam epitaxy (MBE), for example, the layer sequence is permitted to grow over the complete surface of the Si substrate 1. In order to adjust the electrical and/or mechanical characteristics of the conducting channels, a buffer layer 2, e.g. consisting of undoped $Si_{0.7}Ge_{0.3}$, initially follows the substrate 1. The complete buffer layer 2 has a thickness of approximately 1 μm. The effect of the buffer layer 2 is that crystal defects are primarily localized at the boundary layer formed between the substrate 1 and the buffer layer 2, and that an exact mechanical voltage distribution for the succeeding semiconductor layers occurs as a result of the composition of the $Si_xGe_{1-x}$ alloy used. Following the buffer layer 2 is a first supply layer 3, which is p-doped with boron, for example, up to 10 nm below its outer layer surface, i.e., its layer surface opposite that abutting the surface of the buffer layer 2. This layer 3 is used to adjust the transistor threshold voltage.

This first supply layer 3 is followed by the layer packet 4, composed of an approximately 5 nm thick undoped Si layer 41, in which the desired two-dimensional electron channel forms, as well as a thereon deposited, approximately 3 nm thick $Si_{0.7}Ge_{0.3}$ layer 42 in sequence, which is also not doped. Additional electron channels for conducting are made available through repeating the two layers 41 and 42. The thickness and composition of the layers 41 and 42 are below the so-called critical layer thickness for the growth parameters used.

A second supply layer 5, e.g., with the composition $Si_{0.7}Ge_{0.3}$, is deposited on the layer packet 4. This second supply layer 5 could also be composed of a $Si_xGe_{1-x}$ alloy, the Ge content of which declines constantly toward its outer surface. The Ge content in that case is highest with 30 atomic percent at the boundary surface to the second supply layer 5 and decreases with increasing layer thickness to approximately zero atomic percent. Through a continuous reduction in the Ge content, a conduction band jump at the transition to a cover layer 6 is avoided.

A cover layer 6 of undoped silicon with a thickness of approximately 5 nm completes the heterostructure layer sequence. The contacts or electrodes 11, 12 and 13, which are necessary for a field-effect transistor, are deposited on the layer 6. The electrodes 11 and 13 are ohmic contacts while the control electrode 12 either forms a Schottky contact with the layer 6 or is formed as an MOS contact, i.e., an insulation layer on the surface of layer 6 and an overlying metal contact. The distance of the control electrode 12 from the upper n-conducting channel can be achieved through a reduction in the layer thickness of the cover layer 6. This can also be done locally with an etching operation in the region of the control electrode 12. An ion implantation 10, which extends in the region of the source and drain connections 11 and 13 from the layer 2 to the layer 6, ensures a low-ohmic contact of the two electrodes 11 and 13.

Figure 2:
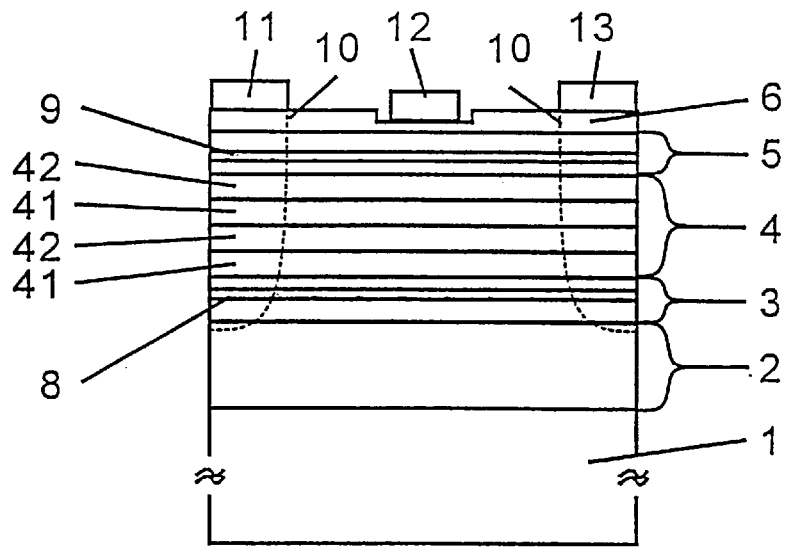
FIG. 2 is a schematic cross section through a HFET, which is designed as two-channel n-MODFET.

In the embodiment according to FIG. 2, a buffer layer 2 is again permitted to grow on a substrate 1. A thin (approx. 2 nm), spatially limited n-doping 8 is inserted, e.g. with antimony, into the following, first supply layer 3, which results in a higher electron concentration in the channels. The p-doping 7 for adjusting the threshold value in the supply layer 3 according to FIG. 1 can be omitted here, owing to the existing n-doping 8. The layer packet 4 with, for example, two n-conducting channels follows the supply layer 3, analogous to the first example, i.e., FIG. 1. Analogous to the first supply layer 3, a n-doped zone 9, located near the boundary surface to layer 4 but not touching it, is located inside a second supply layer 5 grown on the outer surface of the layer packet 4. This doping 9 also serves to increase the electron concentration in the channels. This is again followed by a cover layer 6, analogous to the example of FIG. 1, onto which the electrodes 11, 12 and 13 of the transistor are deposited.

Figure 3:
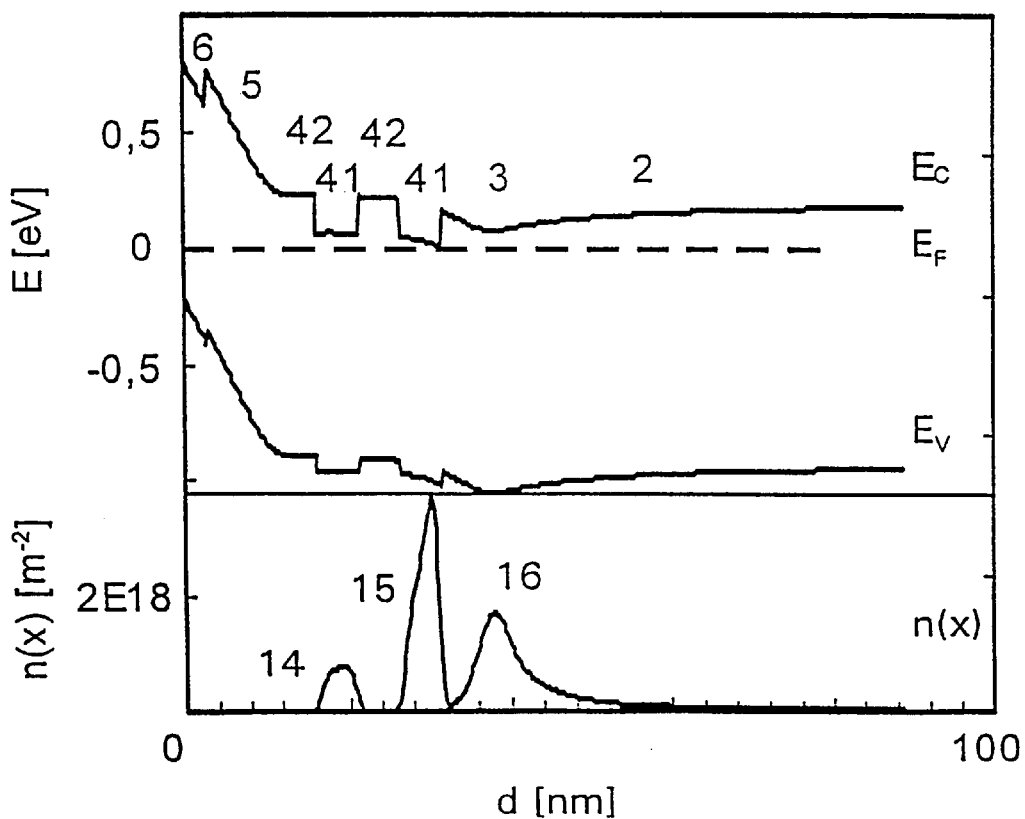
FIG. 3 is a simulation calculation of the course of the band-structure and the electron concentration in the two-channel n-MODFET according to FIG. 2.

FIG. 3 shows a simulation calculation of the course of the band structure and the electron concentration of the two-channel n-MODFET according to FIG. 2. Shown is the course of the conduction band $E_c$ and the valence band $E_v$ in relation to the Fermi level $E_F$. The two channels of the two-dimensional DEG, created by the layers 41 and 42 which develop as a result of the heterostructure layer sequence, can be seen in the course for the conduction band. The reference numbers on the conduction band correspond to those in FIG. 2. The increase in the modulation effectivity, achieved as a result of the heterostructure layer sequence, confirms the electron concentration n(x), which has two clear maxima 14 and 15 in the channels. The charge carriers moving within the channels have a higher charge carrier mobility as compared to the charge carriers 16, which flow in the region of the doping layer 8. The conduction band jump created near the surface through the contact of layers 5 and 6 is not important for the electrical characteristics of the transistor, since the course of the band there is high above the Fermi level and the electron concentration present there is very low. The decreasing Ge content in layer 5, suggested as an alternative for the layer structure, causes the jump in the conduction band to be eliminated completely if necessary. It also follows from the course of the electron concentration that the doped zone 9 in layer 5 has only a small number of charge carriers. In one modification, this doping 9 is therefore omitted completely.

Figure 4:
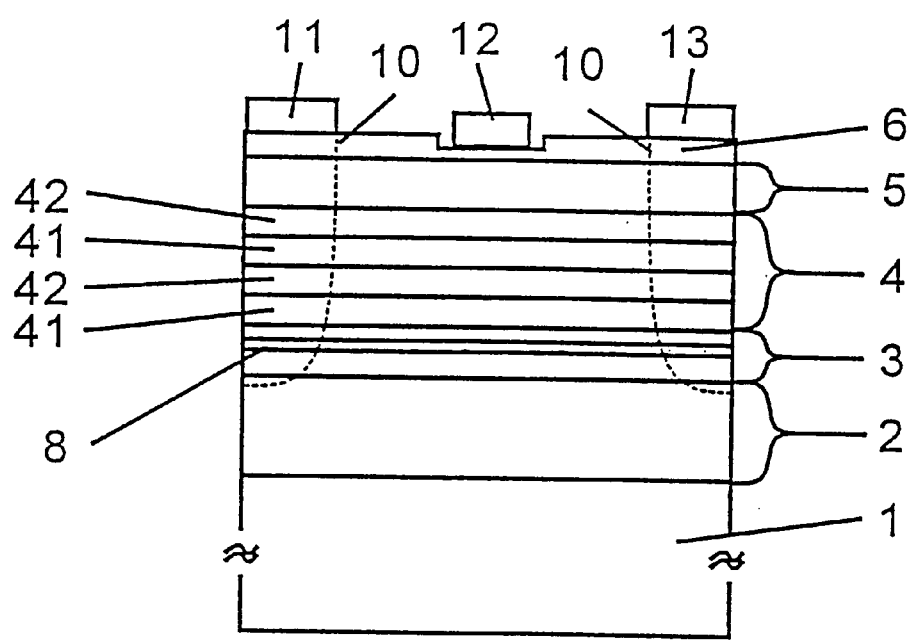
FIG. 4 is a schematic cross section through a HFET, configured as two-channel p-MODFET.

FIG. 4 shows the layer sequence of a p-MODFET. The substrate 1 used is again monocrystalline silicon with orientation (100) with a specific resistance of, for example, $10^3$ Ωcm. The substrate 1 is followed initially by a buffer layer 2, e.g., grown on the Si substrate surface with the aid of the molecular-beam epitaxy (MBE), for adjusting the electrical and/or mechanical characteristics of the conducting channels on the substrate. This buffer layer 2 consists of an undoped $Si_xGe_{1-x}$ alloy with a total thickness of, for example, find in which the Ge content increases continuously. At the boundary surface to the substrate 1, the Ge content of the layer 2 is lowest with approximately 5 atomic percentages and increases over the thickness of the layer 2 to approximately 70 atomic percentages. This is followed by a first supply layer 3 of SiGe with a thickness of approximately 500 nm and a constant Ge content of 70 atomic percentages. A thin (approximately 2 nm), spatially limited p-doping 8, e.g., with boron is inserted into this supply layer 3, in a manner similar to the previously described examples. The first supply layer 3 is followed by the layer packet 4, consisting of an approximately 3 nm thick, undoped layer 41 of $Si_{0.3}Ge_{0.7}$, as well as a thereon deposited or grown and approximately 5 nm thick layer 42 of $Si_{0.1}Ge_{0.9}$, in which the desired two-dimensional hole channel is also and which is also undoped. The layers 41 and 42 once more are repeated so that a second two-dimensional hole channel forms. Additional hole channels for conducting can be made available by repeating the layers 41 and 42 several times as desired. A second, approximately 20 nm thick supply layer 5 composed of $Si_{0.3}Ge_{0.7}$ is applied to the upper most layer 42. An approximately 5 nm thick cover layer 6 of undoped silicon completes the heterostructure layer sequence. The contacts 11, 12 and 13, necessary for a field-effect transistor, are deposited on the cover layer 6, analogous to the example of FIG. 1.

The invention is not limited to the specified embodiments, but can be applied to other embodiments as well. For example, it is conceivable to form a heterolayer structure comparable to the subject-matter of the invention by using other materials, such as GaAs/GaAlAs.

The invention now being fully described, it will be apparent to one of the ordinary skill in the art that many changes and modifications can be made thereto without departing from the spirit or scope of the invention as set forth herein.

What is claimed:

1. A heterostructure field effect transistor with a high modulation effectivity, comprising: a semiconductor substrate; a semiconductor heterostructure layer sequence deposited on a surface of the semiconductor substrate and including a buffer layer formed on the surface of the substrate, a first supply layer formed on the surface of the buffer layer, a layer packet composed of a plurality of pairs of undoped layers of different semiconductor materials with each pair forming a respective heterojunction to provide at least two heterojunctions and at least two n-conducting channels (n-HFET) or p-conducting channels (p-HFET), a second supply layer formed on the layer packet, and an undoped cover layer formed on the second supply layer; first and second laterally spaced ohmic contacts on the surface of the cover layer; and a control electrode for the transistor disposed on the surface of the cover layer between the first and second ohmic contacts; and wherein the substrate is a high-ohmic silicon substrate with a specific resistance of at least $10^2$ Ωcm.

2. A heterostructure field effect transistor with a high modulation effectivity, comprising: a semiconductor substrate; a semiconductor heterostructure layer sequence deposited on a surface of the semiconductor substrate and including a buffer layer formed on the surface of the substrate, a first supply layer formed on the surface of the buffer layer, a layer packet composed of a plurality of pairs of undoped layers of different semiconductor materials with each pair forming a respective heterojunction to provide at least two heterojunctions and at least two n-conducting channels (n-HFET) or p-conducting channels (p-HFET), a second supply layer formed on the layer packet, and an undoped cover layer formed on the second supply layer; first and second laterally spaced ohmic contacts on the surface of the cover layer; and a control electrode for the transistor disposed on the surface of the cover layer between the first and second ohmic contacts; and wherein:

the transistor is an n-HFET;
the substrate is a high-ohmic silicon substrate;
the buffer layer is composed of a first Si/Ge alloy;

the first supply layer is composed of a second Si/Ge alloy;
the undoped layer packet is composed of several alternating layers of undoped silicon and an undoped third Si/Ge alloy to form several heterojunctions and several n-conducting channels;
the second supply layer is composed of a fourth Si/Ge alloy;
the undoped cover layer is composed of silicon; and,
the control electrode is one of a metal layer which forms a Schottky contact with the cover layer and an MOS contact composed of an oxide and a metal layer.

3. A heterostructure field effect transistor according to claim 2, wherein the distance between the control electrode and the upper conducting channel is adjusted to a desired value by a reduction of the cover layer thickness in the gate region of the transistor.

4. A heterostructure field effect transistor according to claim 2, wherein the first supply layer has a p-doping with $10^{14}$ to $10^{16}$ atoms per $cm^3$ for providing a transistor threshold voltage adjustment, which doping extends to a distance of 2 to 20 nm from the outer surface of the first supply layer.

5. A heterostructure field effect transistor according to claim 2, wherein the germanium content of the buffer layer and of the first supply layer is in the range of 20 to 50 atomic percent.

6. A heterostructure field effect transistor according to claim 5, wherein the germanium content of the buffer layer and of the first supply layer is in the range of 30 to 40 atomic percent.

7. A heterostructure field effect transistor according to claim 2, wherein the first supply layer contains an n-doping at a distance of 2 to 10 nm from the layer surface.

8. A heterostructure field effect transistor according to claim 2, wherein the germanium content of the undoped third Si/Ge alloy is in the range of 20 to 50 atomic percent.

9. A heterostructure field effect transistor according to claim 2, wherein the germanium content of the second supply layer is in the range of 20 to 60 atomic percent.

10. A heterostructure field effect transistor according to claim 9, wherein the germanium content of the second supply layer is in the range of 30 to 40 atomic percent.

11. A heterostructure field effect transistor according to claim 2, wherein the second supply layer contains a second n-doping region at a distance of 2 to 10 nm from the underside of the second supply layer.

12. A heterostructure field effect transistor with a high modulation effectivity, comprising: a semiconductor substrate; a semiconductor heterostructure layer sequence deposited on a surface of the semiconductor substrate and including a buffer layer formed on the surface of the substrate, a first supply layer formed on the surface of the buffer layer, a layer packet composed of a plurality of pairs of undoped layers of different semiconductor materials with each pair forming a respective heterojunction to provide at least two heterojunctions and at least two n-conducting channels (n-HFET) or p-conducting channels (p-HFET), a second supply layer formed on the layer packet, and an indoped cover layer formed on the second supply layer; first and second laterally spaced ohmic contacts on the surface of the cover layer; and a control electrode for the transistor disposed on the surface of the cover layer between the first and second ohmic contacts; and wherein:

the transistor is a p-HFET;
the substrate is a high-ohmic silicon substrate;
the buffer layer is composed of a first Si/Ge alloy which is deposited on the silicon substrate;

the first supply layer is composed of a second Si/Ge alloy;

the multi-heterostructure undoped layer packet is composed of several alternating layers of an undoped layer of a third Si/Ge alloy and an undoped layer of a fourth Si/Ge alloy with a higher Ge content than the third Si/Ge alloy to form several heterojunctions and several p-conducting channels;

the second supply layer is composed of a fifth Si/Ge alloy;

the undoped cover layer is composed of silicon; and, the control electrode is one of a metal layer which forms a Schottky contact with the cover layer and an MOS contact composed of an oxide and a metal layer.

13. A heterostructure field effect transistor according to claim 12, wherein the first supply layer has an n-doping with $10^{14}$ to $10^{16}$ atoms per $cm^3$ for providing a transistor threshold voltage adjustment, which n-doping extends to a distance of 2 to 10 nm from the outer surface of the first supply layer.

14. A heterostructure field effect transistor according to claim 12, wherein the germanium content of the buffer layer is between 5 and 100 atomic percent and increases continuously from 5 atomic percentages to the maximum value with increasing distance from the substrate, and the first supply layer has a constant germanium content of the achieved maximum value of the buffer layer.

15. A heterostructure field effect transistor according to claim 12, wherein the first supply layer contains a p-doping at a distance of 2 to 10 nm from the layer surface.

16. A heterostructure field effect transistor according to claim 12, wherein the germanium content of the undoped third Si/Ge alloy is in the range of 50 to 90 atomic percent and the germanium content of the undoped fourth Si/Ge alloy is in the range of 60 to 100 atomic percent.

17. A heterostructure field effect transistor according to claim 12, wherein the germanium content of the second supply layer is in the range of 5 to 100 atomic percent, and decreases with an increasing layer thickness in the direction of the cover layer.

18. A heterostructure field effect transistor according to claim 12, wherein the second supply layer contains a p-doping region at a distance of 2 to 10 nm from the inner surface of the second supply layer.

19. A hetero,structure field effect transistor according to claim 12, wherein the distance between the control electrode and the upper conducting channel is adjusted to a desired value by a reduction of the cover layer thickness in the gate region of the transistor.

* * * * *